United States Patent
Hong et al.

(10) Patent No.: US 12,448,543 B2
(45) Date of Patent: Oct. 21, 2025

(54) POLISHING COMPOSITION FOR SEMICONDUCTOR PROCESS AND MANUFACTURING METHOD FOR POLISHED ARTICLE

(71) Applicants: SK enpulse Co., Ltd., Pyeongtaek-si (KR); SK HYNIX INC., Icheon-si (KR)

(72) Inventors: Seung Chul Hong, Seoul (KR); Deok Su Han, Seoul (KR); Jin Hyuk Lim, Icheon-si (KR); Donghyun Kim, Icheon-si (KR); Jieun Lee, Icheon-si (KR)

(73) Assignees: SK enpulse Co., Ltd., Pyeongtaek-si (KR); SK HYNIX INC., Icheon-si (KR)

( * ) Notice: Subject to any disclaimer, the term of this patent is extended or adjusted under 35 U.S.C. 154(b) by 359 days.

(21) Appl. No.: 17/859,301

(22) Filed: Jul. 7, 2022

(65) Prior Publication Data
US 2023/0019730 A1 Jan. 19, 2023

(30) Foreign Application Priority Data
Jul. 8, 2021 (KR) .................. 10-2021-0089817

(51) Int. Cl.
C09G 1/02 (2006.01)
H01L 21/321 (2006.01)
H01L 21/768 (2006.01)

(52) U.S. Cl.
CPC ............ C09G 1/02 (2013.01); H01L 21/3212 (2013.01); H01L 21/76883 (2013.01)

(58) Field of Classification Search
CPC . C09G 1/02; H01L 21/3212; H01L 21/76883; H01L 21/31053; H01L 21/304;
(Continued)

(56) References Cited

U.S. PATENT DOCUMENTS 5,786,989 A 7/1998 Fitzpatrick
6,440,187 B1 * 8/2002 Kasai .................. C01F 7/448
106/3
(Continued)

FOREIGN PATENT DOCUMENTS

CN 1574238 A 2/2005
CN 1667026 A 9/2005
(Continued)

OTHER PUBLICATIONS

KR-20170077492-A, Machine Translation, IP.com. (Year: 2024).*
(Continued)

*Primary Examiner* — Duy Vu N Deo
*Assistant Examiner* — Christopher M Remavege
(74) *Attorney, Agent, or Firm* — NSIP Law (57) ABSTRACT

Embodiments provide a polishing composition for a semiconductor process facilitating the formation of a microcircuit pattern and minimizing the generation of defects and scratches and a method of preparing a polished article using the same.

Embodiments provide a polishing composition for a semiconductor process, in which the absorbance ratio of a group having a specific size of particle diameter compared to the overall average particle size ($D_{50}$) is a predetermined ratio or less with respect to the absorbance of a group having a particle diameter more than 0.5 times and 2.5 times or less the overall average particle size.

13 Claims, 5 Drawing Sheets

(58) Field of Classification Search
CPC ... H01L 21/30625; C09K 3/14; C09K 3/1409;
C09K 3/1454
See application file for complete search history.

(56) References Cited

U.S. PATENT DOCUMENTS

| | | | |
|---|---|---|---|
| 8,518,135 B1* | 8/2013 | Lorpitthaya | C09G 1/02 438/692 |
| 9,127,187 B1 | 9/2015 | Grumbine et al. | |
| 10,844,244 B2* | 11/2020 | Park | H01L 21/30625 |
| 2002/0169216 A1 | 11/2002 | Fukuda et al. | |
| 2003/0200702 A1* | 10/2003 | Lee | C09K 3/1463 106/3 |
| 2004/0261323 A1 | 12/2004 | Minamihaba et al. | |
| 2005/0252092 A1 | 11/2005 | Kim et al. | |
| 2006/0234509 A1* | 10/2006 | Small | C09G 1/02 438/692 |
| 2008/0207091 A1* | 8/2008 | Jeng | C09G 1/02 451/37 |
| 2010/0120250 A1* | 5/2010 | Amanokura | C23F 3/06 438/693 |
| 2012/0156874 A1 | 6/2012 | Han et al. | |
| 2013/0270490 A1* | 10/2013 | De La Vega | B82Y 30/00 252/514 |
| 2015/0102012 A1* | 4/2015 | Reiss | H01L 21/30625 252/79.1 |
| 2015/0267082 A1 | 9/2015 | Grumbine et al. | |
| 2015/0354058 A1* | 12/2015 | Morinaga | C23C 14/08 428/141 |
| 2016/0194539 A1* | 7/2016 | Nagai | C09K 3/1463 51/309 |
| 2016/0257856 A1* | 9/2016 | Reiss | C09G 1/04 |
| 2017/0283673 A1 | 10/2017 | Zhou et al. | |
| 2018/0022960 A1* | 1/2018 | Serikawa | C09K 3/1463 451/36 |
| 2018/0094166 A1 | 4/2018 | Guo et al. | |
| 2019/0127607 A1 | 5/2019 | Rose et al. | |
| 2021/0130739 A1* | 5/2021 | Kayakubo | C11D 3/2096 |
| 2021/0246346 A1* | 8/2021 | Hasegawa | C09K 3/1409 |
| 2022/0033680 A1* | 2/2022 | Iwano | C09K 3/1436 |
| 2023/0081442 A1* | 3/2023 | Lin | C09G 1/02 438/693 |

FOREIGN PATENT DOCUMENTS

| | | | | |
|---|---|---|---|---|
| CN | 102585704 A | 7/2012 | | |
| CN | 104893587 A | 9/2015 | | |
| CN | 106414650 A | 2/2017 | | |
| CN | 107267118 A | 10/2017 | | |
| CN | 107880783 A | 4/2018 | | |
| CN | 108949034 A | 12/2018 | | |
| CN | 109722172 A | 5/2019 | | |
| CN | 112680115 A | 4/2021 | | |
| EP | 3 231 848 B1 | 10/2017 | | |
| EP | 3 476 910 B1 | 5/2019 | | |
| JP | 2012143823 A | * | 8/2012 | ........... B24B 37/044 |
| JP | 7455066 B2 | * | 3/2024 | ........... B24B 37/044 |
| KR | 20090073729 A | * | 7/2009 | ............... C09K 3/14 |
| KR | 10-2010-0084302 A | | 7/2010 | |
| KR | 20100084351 A | * | 7/2010 | ........... B24B 37/044 |
| KR | 10-1197163 B1 | | 11/2012 | |
| KR | 10-2013-0129397 A | | 11/2013 | |
| KR | 10-2016-0026304 A | | 3/2016 | |
| KR | 10-1686255 B1 | | 12/2016 | |
| KR | 20180075347 A | * | 12/2016 | |
| KR | 20170039971 A | * | 4/2017 | ........... H01L 21/461 |
| KR | 20170077492 A | * | 7/2017 | |
| KR | 10-2019-0139561 A | | 12/2019 | |
| KR | 20210027467 A | * | 3/2021 | |
| TW | 200621924 A | | 7/2006 | |
| TW | 201425557 A | | 7/2014 | |
| TW | 201518492 A | * | 5/2015 | ............... B24B 1/00 |
| WO | WO-2015060410 A1 | * | 5/2015 | ............... C09D 5/00 |
| WO | WO-2017002705 A1 | * | 1/2017 | ............. B24B 37/00 |

OTHER PUBLICATIONS

KR-20170077492-A, Machine Translation. (Year: 2024).*
KR-20210027467-A, Machine Translation. (Year: 2024).*
WO-2015060410-A1, Machine Translation. (Year: 2024).*
JP-7455066-B2, Machine Translation. (Year: 2025).*
KR-20180075347-A (Year: 2025).*
TW-201518492-A, Machine Translation. (Year: 2025).*
WO-2017002705-A1, Machine Translation. (Year: 2025).*
KR-20090073729-A, Machine Translation. (Year: 2025).*
KR-20100084351-A, Machine Translation. (Year: 2025).*
KR-20170039971-A, Machine Translation. (Year: 2025).*

* cited by examiner

POLISHING COMPOSITION FOR SEMICONDUCTOR PROCESS AND MANUFACTURING METHOD FOR POLISHED ARTICLE

CROSS-REFERENCE TO RELATED APPLICATION

This application claims priority to and the benefit of Korean Patent Application No. 10-2021-0089817, filed on Jul. 8, 2021, in the Korean Intellectual Property Office, the entire disclosure of which is incorporated herein by reference for all purposes.

BACKGROUND

1. Field

The present application relates to a polishing composition for a semiconductor process and a method of manufacturing a polished article using the same.

2. Discussion of Related Art

Semiconductor process materials are materials used in the process of making semiconductor chips, and may be divided into process materials and post-process materials depending on an application purpose.

A pre-process refers to a patterning process for producing a wafer and forming a circuit on a wafer, and a post-process refers to a process of producing a discrete chip by cutting a substrate based on the circuit made previously, forming a contact structure and packaging it.

Since micropatterns and stacked circuits of a semiconductor are formed during a semiconductor process, particularly, a pre-process, among these, a polishing process for planarizing an unnecessarily-formed thin film or an uneven structure is essentially performed. The polishing process is referred to as a so-called chemical mechanism polishing (CMP) process, and corresponds to a process of polishing a wafer surface or a metal film layer on a wafer by inputting and pressing a polishing composition between the wafer and a polishing pad.

Mechanical polishing is performed while the polishing pad and the polishing composition are in contact with the wafer, and chemical polishing is performed by the chemical reaction between the polishing composition and a wafer film.

Recently, since the circuit pattern of the wafer has line widths, which are gradually decreasing, and the pattern structure tends to be more complicated, the polishing process has to be more finely adjusted. Therefore, research and development are being actively carried out in various ways.

The above-mentioned background art is technical information that the present inventors have recognized to deduce embodiments or acquired in the process of derivation, and it cannot be said that it is necessarily known technology disclosed to the general public prior to the filing of the present application.

As related art, there are "CMP slurry" disclosed in Korean Patent Publication No. 10-1197163 and "chemical mechanical polishing (CMP) solution with improved performance" disclosed in Korean Patent Publication No. 10-1686255.

SUMMARY OF THE INVENTION

Embodiments are directed to providing a polishing composition for a semiconductor process, which is easy to apply to a substrate forming a fine pattern and minimizes the occurrence of defects and scratches, and a method of manufacturing a polished article using the same.

Embodiments are also directed to providing a polishing composition for a semiconductor process, in which the absorbance ratio of a group having a specific size of particle diameter compared to the overall average particle size ($D_{50}$) is a predetermined ratio or less with respect to the absorbance of a group having a particle diameter more than 0.5 times and 2.5 times or less the overall average particle size.

Embodiments are also directed to providing a polishing composition for a semiconductor process, in which the formation of an unnecessary peak except for the maximum peak in the absorbance spectrum compared to the particle size distribution is decreased.

To achieve the above-described purposes, embodiments of the present application provide a polishing composition for a semiconductor process including, polishing particles that have an overall average particle size corresponding to $D_{50}$, and include a plurality of polishing particle groups with different average particle sizes, in which a first polishing particle group is a group with a particle diameter of more than 22.5- and 125 times or less the overall average particle size, a second polishing particle group is a group with a particle diameter of more than 0.5 times and 2.5 times or less the overall average particle size, an absorbance is defined by Equation 1 below, and the ratio A1/A2 of the absorbance A1 of the first polishing particle group and the absorbance A2 of the second polishing particle group is 1.5 or less.

$$\text{Absorbance}=\log(I0/I1) \qquad \text{[Equation 1]}$$

In Equation 1, I0 is an amount of light when irradiating light of at least one wavelength of 385 to 425 nm in a liquid in which a grain size gradient is formed by centrifuging the polishing composition for a semiconductor process, and I1 is an amount of the irradiated light passing through the liquid.

According to one embodiment, the overall average particle size ($D_{50}$) of the polishing particles may be 20 to 60 nm.

According to one embodiment, the absorbance fraction of the first polishing particle group relative to the absorbance of the total polishing particles may be 50% or less.

According to one embodiment, the absorbance fraction of the second polishing particle group relative to the absorbance of the total polishing particles may 38% or more.

According to one embodiment, the first polishing particle group may be a group with a particle diameter of 37.5 to 125 times the overall average particle size, the ratio A1a/A2 of the absorbance A1a of the 1a polishing particle group and the absorbance A2 of the second polishing particle group may be 0.8 or less.

According to one embodiment, the polishing particles may include any one or more polishing particles selected from the group consisting of silica, ceria, cerium hydroxide, diamond, zirconia, titania, zeolite, and silicon nitride.

According to one embodiment, the polishing composition may include the polishing particles at 5 wt % or more and 20 wt % or less, and one or more additives selected from the group consisting of a dispersant, a corrosion inhibitor, a polishing rate enhancer, a pH adjuster, and a surfactant.

According to one embodiment, in Equation 1, the rotational speed in centrifugation may be 14,000 rpm, and the viscosity of the liquid may be 1.8 cp.

According to one embodiment, the polishing composition may be applied as a slurry for chemical mechanical polishing.

According to one embodiment, the scratch is a defect having a length of 1 μm or more,
when polishing a silicon wafer, the polishing rate is 1,000 Å/min or more, and
less than one scratch is formed on the polished silicon wafer.

To achieve the above-described purposes, a method of manufacturing a polished article according to an embodiment may include
a polishing step of polishing a target using the polishing composition for a semiconductor process, wherein
the target may be any one or more selected from a substrate, a metal formed on the substrate, and an insulating film formed on the substrate.

According to one embodiment, the target may be a substrate having a concave or convex pattern on the surface thereof,
the concave or convex pattern may include a metal, and
the width of the concave pattern may range from 3 to 16 nm.

BRIEF DESCRIPTION OF THE DRAWINGS

The above and other objects, features and advantages of the present application will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, one or more embodiments will be described in detail with reference to the accompanying drawings so that those of ordinary skill in the art can easily carry out the present application. However, the present application may be implemented in a variety of different forms, and is not limited to the embodiments described herein. In addition, for clear explanation of the present application in the drawings, parts that are not related to the description are omitted, and like numerals denote like parts throughout the specification.

Throughout the specification, when one part "includes" a component, it means that it may also include other components, not excluding components unless particularly stated otherwise.

Throughout the specification, when one component is "connected" with another component, it means that the one component is "directly connected," or "indirectly connected" with a third component therebetween.

Throughout the specification, the "A is disposed on B" means that B is located directly on A, or B is located on A while another layer is disposed between them, and it is not interpreted as being limited to B being positioned in contact with the surface of A.

Throughout the specification, the term "combination thereof" included in the Markush-type expression refers to a mixture or combination of one or more selected from the group consisting of constituents described in the Markush-type expression, and includes one or more selected from the group consisting of the constituents.

Throughout the specification, the expression "A and/or B" means "A, B, or A and B".

Throughout the specification, the term "first," "second," "A," or "B" is used to distinguish the same terms from each other unless specified otherwise.

Throughout the specification, the singular expression is to be construed as meaning including singular or the plural interpreted from the context unless specified otherwise.

During the process of manufacturing a semiconductor device, polishing particles having an overall average particle size ($D_{50}$) of several tens to hundreds of nanometers may be used to stably polish a substrate on which a microcircuit pattern is formed. However, the overall average particle size ($D_{50}$) values alone may not accurately represent coarse polishing particles that adversely affect the formation of a microcircuit pattern, and it may be difficult to ensure reproducibility when polishing a substrate on which several-nanometer-sized interconnections are formed.

Therefore, the present inventors invented a polishing composition for a semiconductor process, which includes a plurality of polishing particle groups having a specific ratio of absorbance measured by centrifugation and light scattering during the consideration of a composition for stably polishing a substrate on which a several-nanometer-sized microcircuit pattern is formed, and embodiments thereof will be presented.

Polishing Composition for Semiconductor Process

To achieve the above-described purposes, a polishing composition for a semiconductor process according to one embodiment includes
polishing particles that have an overall average particle size corresponding to $D_{50}$, and include a plurality of polishing particle groups with different average particle sizes,
in which a first polishing particle group is a group with a particle diameter of more than 22.5 times and 125 times or less the overall average particle size,
a second polishing particle group is a group with a particle diameter of more than 0.5 times and 2.5 times or less the overall average particle size,
an absorbance is defined by Equation 1 below, and
the ratio A1/A2 of the absorbance A1 of the first polishing particle group and the absorbance A2 of the second polishing particle group is 1.5 or less.

$$\text{Absorbance} = \log(I0/I1) \qquad \text{[Equation 1]}$$

In Equation 1, I0 is an amount of light when irradiating light of at least one wavelength of 385 to 425 nm in a liquid in which a grain size gradient is formed by centrifuging the polishing composition for a semiconductor process, and I1 is an amount of the irradiated light passing through the liquid. For the I0, the irradiated light may be light with a wavelength of 405 nm.

Figure 4:
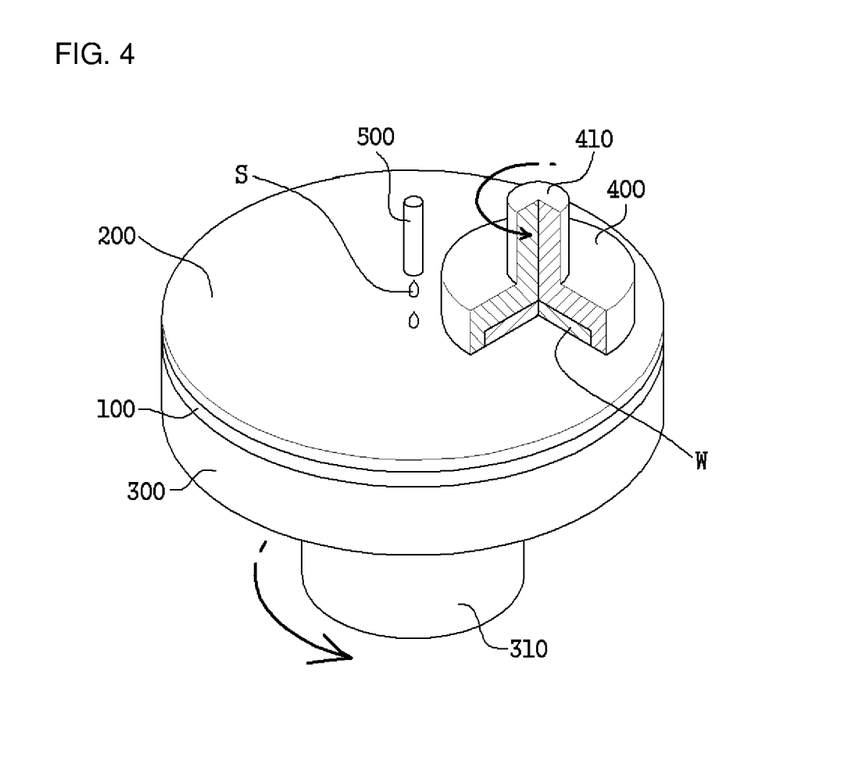
FIG. 4 is a schematic diagram showing examples of factors applied to the polishing of a substrate.

In the polishing composition for a semiconductor process, the semiconductor process may be a chemical mechanical polishing (CMP) process. The CMP process is a process of planarizing the surface of a substrate such as a wafer using a polishing pad and a slurry composition. The CMP process may be generally performed using an apparatus as shown in FIG. 4. For example, the process may be performed by adhering the polishing pad to a surface plate 300, and rotating a polishing head 400 that fixes the substrate and the surface plate while bringing the substrate W along with a slurry S provided from a spray nozzle 500 in contact with the surface of the polishing pad.

The overall average particle size ($D_{50}$) of the polishing particles may be 20 to 60 nm, 20 to 50 nm, or 20 to 45 nm. When the overall average particle size is more than 52 nm, there is a risk of excessively causing scratches or defects on the wafer on which a several-nanometer-sized microcircuit pattern is formed, and when the overall average particle size is less than 20 nm, there is a risk that the polishing rate is lowered and irregularly aggregated particles are generated.

When the overall average particle size ($D_{50}$) of the polishing particles is 40 nm, the particle diameter of the first polishing particle group may be 0.9 to 5 μm, and the particle diameter of the second polishing particle group may be 20 to 100 nm.

Generally, even when the overall average particle size ($D_{50}$) of slurries including the polishing particles satisfies 60 nm or less, it is not easy to reliably determine how many hundreds of nano- or micro-scale particles are contained by a conventional method such as dynamic light scattering. When such slurries were applied to the CMP polishing process, it was difficult to ensure the reproducibility of a microcircuit pattern.

To solve to the above-described problems of the polishing composition for a semiconductor process according to one embodiment, absorbances were measured by applying light to a liquid forming a grain size gradient by centrifuging the composition including polishing particles and satisfy a specific ratio between groups with specific multiples of particle size with respect to the overall average particle size, so the occurrence of scratches is minimized and microcircuit patterns are easily formed in the CMP process.

The absorbance indicates the degrees of light absorption and scattering of a target in light irradiation. Therefore, the relative absorbance of the target may be measured from the amount of light in the light irradiation to the target and the amount of light after irradiation.

Figure 1A:
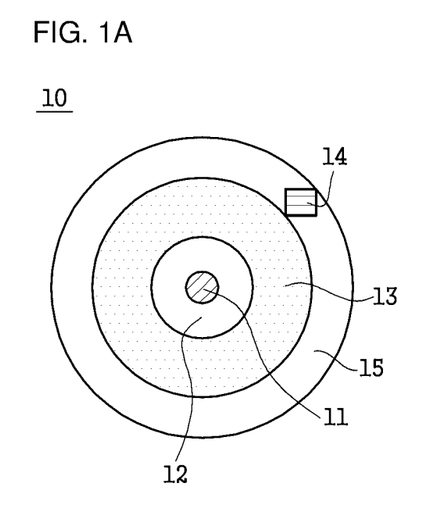
FIGS. 1A and 1B are conceptual diagrams showing an example of an absorbance measurement apparatus used in the measurement of the absorbance of a polishing composition for a semiconductor process according to one embodiment.
Figure 1B:
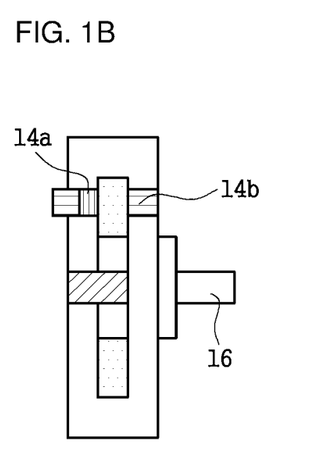

As shown in FIGS. 1A and 1B, the apparatus used in the absorbance measurement may include a sorting unit 13 including a space having a ring-shaped cross-section and accommodating a target; a diffusion unit 12 included in the sorting part to provide the target to the sorting unit; an input unit 11 inputting the target to the diffusion unit; a main body 15 finishing the appearances of the sorting unit and the diffusion unit; a rotation unit 16 connected with the main body and rotating the sorting unit in a circumferential direction of the sorting unit; a measurement unit 14 moving in a diameter direction of the sorting unit, applying light to the space in the sorting unit, and measuring the light amount; an irradiation unit 14a applying light into the sorting unit from the measurement unit; and a sensor 14b detecting the amount of light passing through the sorting unit. For example, the apparatus used in the absorbance measurement may be DC24000 UHR produced by CPS Instruments.

In Equation 1, the rotational speed during centrifugation may be 12,000 to 16,000 rpm, or 14,000 rpm. The viscosity of the liquid may be 1.6 to 2.0 cp, or 1.8 cp. The liquid may include polyethylene glycol, polyvinylpyrrolidone, a halocarbon, or sucrose.

A relatively high absorbance according to Equation 1 means that corresponding polishing particles absorb light or have a high degree of scattering, and may be associated with the number of corresponding polishing particles. However, in particles of several hundreds of nanometers to several micrometers, even when the absorbance of light with at least one wavelength from 385 to 425 nm (e.g., light with a wavelength of 405 nm) is high, it cannot be concluded that the number of particles is large. This is because the light absorption per particle increases due to the relatively large particle size. Nevertheless, it is important to relatively reduce the absorbance ratio of particles of several hundreds of nanometers to several micrometers, and in some embodiments, the absorbance ratio is allowed to satisfy a specific ratio or less.

In the polishing composition for a semiconductor process, the ratio A1/A2 of the absorbance A1 of the first polishing particle group having a particle size of more than 22.5 times and 125 times or less the overall average particle size and the absorbance A2 of the second polishing particle group having a particle size of more than 0.5 times and 2.5 times or less the overall average particle size may be 1.5 or less, 1.2 or less, or 0.94 or less. When the A1/A2 value is more than 1.5, it may not be easy to form a microcircuit pattern during polishing because the ratio of micro-unit particles that cause scratches is high. By satisfying the A1/A2 value of 1.5 or less, the relative absorbance of scratch-generating particles is low, and a microcircuit pattern can be easily formed during polishing.

With respect to the absorbance of the total polishing particles, in the polishing composition for a semiconductor process, the absorbance fraction of the first polishing particle group may be 50% or less, 45% or less, or 43% or less.

With respect to the absorbance of the total polishing particles, in the polishing composition for a semiconductor process, the absorbance fraction of the second polishing particle group may be 38% or more, 42% or more, or 45.6% or more.

The polishing composition for a semiconductor process satisfying the absorbance fractions of the first polishing particle group, the 1a polishing particle group and the second polishing particle group may exhibit a more stable polishing property when polishing the microcircuit pattern-formed substrate.

The polishing composition for a semiconductor process may include a 1a polishing particle group having a particle size 37.5 to 125 times the overall average particle size ($D_{50}$). When the overall average particle size is 40 nm, the particle size of the 1a polishing particle group may be 1.5 to 5 μm.

The ratio A1a/A2 of the absorbance A1a of the 1a polishing particle group and the absorbance A2 of the second polishing particle group may be 0.8 or less, 0.7 or less, or 0.66 or less.

In the polishing composition for a semiconductor process, the absorbance fraction of the 1a polishing particle group with respect to the absorbance of the total polishing particles may be 31% or less, or 30.3% or less. The absorbance fraction is more than 0%.

By satisfying the absorbance ratio of the first polishing particle group and the second polishing particle group and the absorbance fraction of the 1a polishing particle group, the polishing stability of a microcircuit pattern may be further improved.

Figure 3A:
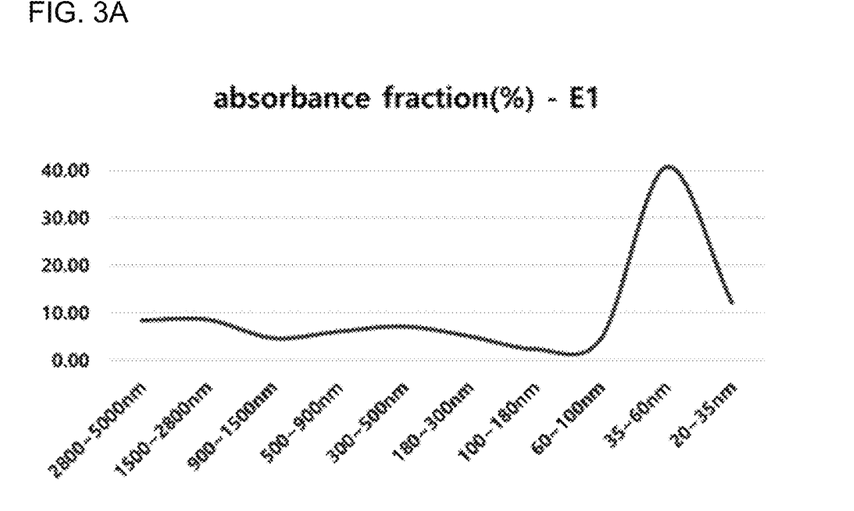
FIG. 3A is a graph showing the absorbance fraction spectrum according to the particle size distribution of polishing particles of Example 1 (E1)
Figure 3B:
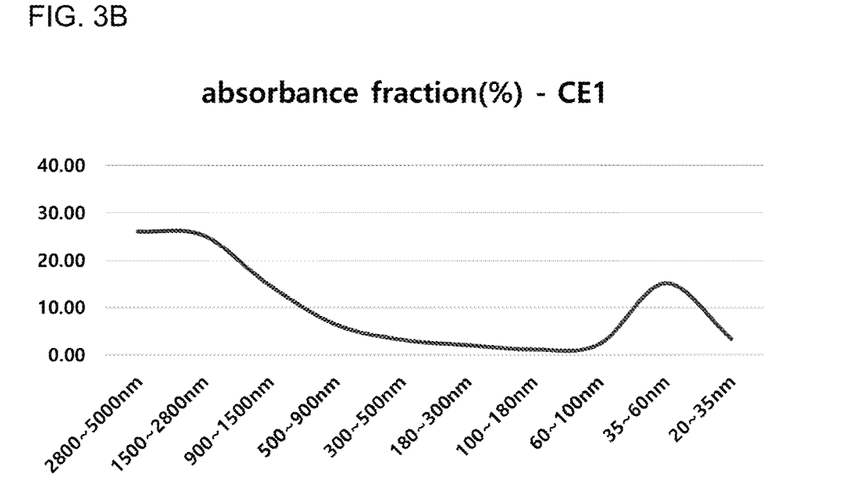
FIG. 3B is a graph showing the absorbance fraction spectrum according to the particle size distribution of polishing particles of Comparative Example 1 (CE1)

As shown in the absorbance spectrum according to Equation 1 per particle size distribution of FIG. 3A, the polishing composition for a semiconductor process may exhibit a maximum peak at the diameter of 60 nm or less and may minimize the generation of an additional peak other than the maximum peak.

The polishing composition for a semiconductor process may include polishing particles, distilled water or deionized water as a solvent, and various additives.

The polishing particles may be any one or more selected from the group consisting of silica, colloidal silica, ceria, cerium hydroxide, diamond, zirconia, titania, zeolite and silicon nitride, and include inorganic composite particles or organic/inorganic composite particles. As an example, the polishing particles may be surface-modified colloidal silica. The organic/inorganic composite particles may be core-shell particles including a core including a polymer resin; and a shell of an inorganic component, which is formed on the surface of the core. The polymer resin of the core may be polymethylmethacrylate or polystyrene, and the inorganic component of the shell may include silica or ceria.

With respect to the total weight of the polishing composition for a semiconductor process, the polishing particles may be included at 2 wt % or more, 5 wt % or more, or 10 wt % or more. The polishing composition for a semiconductor process may include the polishing particles at 20 wt % or less, 16 wt % or less, or 12 wt % or less with respect to the total weight. As the polishing particles are included in the above range, the polishing rate and flatness required in the polishing process can be realized, the reliability of a substrate or interconnection to be polished can increase, and the polishing composition can exhibit stable dispersity.

The polishing composition for a semiconductor process may further include one or more additives selected from the group consisting of a dispersant, a polishing rate enhancer, a pH adjuster, and a surfactant, and further include a polishing modifier.

The dispersant prevents agglomeration between polishing particles and uniformly disperses polishing particles in the polishing composition, a cationic dispersant may increase a zeta potential of the polishing composition in a positive direction, and an anionic dispersant may reduce a zeta potential of the polishing composition in a negative direction.

The dispersant may include an anionic small molecule, a cationic polymer, or an organic acid.

The anionic small molecule of the dispersant may be one or more selected from the group consisting of oxalic acid, citric acid, polysulfonic acid, polyacrylic acid, polymethacrylic acid and a combination thereof.

The cationic polymer of the dispersant may be one or more selected from the group consisting of polylysine, polyethyleneimine, benzethonium chloride, bronidox, cetrimonium bromide, cetrimonium chloride, dimethyldioctadecylammonium chloride, tetramethylammonium hydroxide, distearyldimethylammonium chloride, polyacrylamide, and a combination thereof.

The organic acid of the dispersant may be one or more selected from the group consisting of hydroxybenzoic acid, ascorbic acid, picolinic acid, glutamic acid, tryptophan, aminobutyric acid, and a combination thereof.

The corrosion inhibitor may be included for surface stability of a metal interconnection layer having relatively high corrosiveness by a chemical component on a substrate to be polished, and specifically, may include a mixture of an azole-based compound, a water-soluble polymer and an organic acid. With respect to the total weight of the polishing composition for a semiconductor process, the corrosion inhibitor may be included at 0.5 wt % or more and 1 wt % or less.

The azole-based compound of the corrosion inhibitor may be one or more selected from the group consisting of benzotriazole (BTA), 5-methyl-1H-benzotriazoletriazole, 3-amino-1,2,4-triazole, 5-phenyl-1H-tetrazole, 3-amino-5-methyl-4H-1,2,4-triazole, 5-aminotetrazole (ATA), 1,2,4-triazole, tolytriazole, and a combination thereof.

The water-soluble polymer of the corrosion inhibitor may be one or more selected from the group consisting of polyvinylpyrrolidone, polyvinyl alcohol, polyethylene glycol, polymethacylic acid, and a combination thereof.

The organic acid of the corrosion inhibitor may be one or more selected from the group consisting of acetic acid, formic acid, benzoic acid, nicotinic acid, picolinic acid, alanine, glutamic acid, phthalic acid, and a combination thereof.

The polishing rate enhancer is an additive for increasing the polishing rate of a substrate or interconnection to be polished, and may be one or one or more selected from the group consisting of potassium nitrate, iron nitrate, ammonium hydroxide, citric acid, acetic acid, and a combination thereof.

The pH adjuster may be one that can maintain the pH of the polishing composition in a predetermined range, and may be one or more selected from the group consisting of ammonia, aminomethyl propanol, tetramethyl ammonium hydroxide, potassium hydroxide, sodium hydroxide, magnesium hydroxide, rubidium hydroxide, cesium hydroxide, sodium hydrogen carbonate, sodium carbonate, triethanolamine, tromethamine, niacinamide, nitric acid, sulfuric acid, phosphoric acid, hydrochloric acid, acetic acid, citric acid, glutaric acid, glycolic acid, formic acid, lactic acid, malic acid, malonic acid, maleic acid, oxalic acid, phthalic acid, succinic acid, tartaric acid, and a combination thereof.

The polishing modifier is used to minimize the adsorption of a polishing composition onto a metal surface, and may include an ammonium compound, potassium nitrate, an amino acid, or a salt thereof.

The surfactant may include a non-ionic surfactant, and may include, for example, polyethylene glycol, polypropylene glycol, or a polyethylene-propylene copolymer, which has a molecular weight (Mw) of 10,000 or less and 200 or more.

The surfactant may include a fluorine-based surfactant, for example, a surfactant including a perfluoroalkyl group, and may include a perfluoroalkyl sulfonic acid compound, a perfluoroalkyl carboxylic acid compound, or a perfluoroalkyl phosphate ester compound.

The polishing composition for a semiconductor process may have a pH of 3 to 10.6, and a zeta potential of 15 to 45 mV. In addition, the polishing composition for a semiconductor process may have a pH of 3 to 5, or 3.8 to 4.2. The polishing composition for a semiconductor process may have a zeta potential of 20 to 35 mV, or 22 to 26 mV. When satisfying the above-described pH and zeta potential, the polishing composition may exhibit the optimal polishing rate and stability.

The pH of the polishing composition for a semiconductor process may be adjusted by a pH adjuster such as nitric acid and/or acetic acid.

The polishing composition for a semiconductor process may have a polishing rate of 1000 Å/min or more and 2000

Å/min or less in the polishing of a silicon wafer. In addition, the polishing composition for a semiconductor process may have less than one scratch on the polished silicon wafer. The scratch is a defect with a length greater than 1 μm. Due to the above characteristics, precise and reliable polishing performance may be exhibited.

Method of Preparing Polishing Composition for Semiconductor Process

To achieve the above-described purposes, a method of preparing a polishing composition for a semiconductor process according to one embodiment may include a mixing step of dispersing prepared polishing particles with a solvent and preparing a polishing composition to which an additive is added; and a sorting step of separating polishing particles having an overall average particle size ($D_{50}$) of 20 to 60 nm in the polishing composition.

The polishing particles in the mixing step and the weight ratio thereof are the same as described for the polishing composition for a semiconductor process.

The additive in the mixing step is the same as described for the polishing composition for a semiconductor process.

In the mixing step, when the polishing particles are colloidal polishing particles, a dispersion procedure may be omitted.

In the mixing step, when the polishing particles are silica, high-pressure dispersion and ultrasonic dispersion may be performed, and when the polishing particles are ceria, dispersion may be performed using a milling apparatus.

In the mixing step, the additive may be sufficiently stirred before mixing the polishing particles, and the stirring may be performed at a speed of 50 to 600 rpm for 0.5 to 3 hours.

The additive in the mixing step is the same as described for the polishing composition for a semiconductor process. In the mixing step, stirring may also be performed after mixing the polishing particles at a speed of 50 to 600 rpm for 0.5 to 3 hours.

In the sorting step, relatively large particles may be separated and eliminated using a filter or strainer with a pore of 0.02 to 5 μm. For example, the sorting step may be performed using a filter with a pore of 0.06 to 0.2 μm.

In the polishing composition that has undergone the sorting step, the overall average particle size ($D_{50}$) of the polishing particles may be 20 to 60 nm.

The method of preparing a polishing composition for a semiconductor process may further include a determination step of measuring an absorbance per specific particle group by irradiating a liquid having a grain size gradient formed by centrifuging the polishing composition having undergone the sorting step with light with at least one wavelength (for example, light with a wavelength of 405 nm) from 385 to 425 nm, and determining whether the ratio A1/A2 of the absorbance A1 of a first polishing particle group and the absorbance A2 of a second polishing particle group satisfies 1.5 or less.

In the determination step, the first polishing particle group is a group having a particle size more than 22.5 times and 125 times or less the overall average particle size, and the second polishing particle group is a group having a particle size more than 0.5 times and 2.5 times or less the overall average particle size. The groups are the same as described for the polishing composition for a semiconductor process.

In the determination step, an apparatus and a specific measurement method used in the measurement of the absorbance are the same as described for the polishing composition for a semiconductor process.

The determination step may further include a determination step of measuring an absorbance per specific particle group by applying light with at least one wavelength from 385 to 425 nm to a liquid having a grain size gradient formed by centrifuging the polishing composition having undergone the sorting step and determining whether the ratio A1a/A2 of the absorbance A1a of a 1a polishing particle group and the absorbance A2 of a second polishing particle group satisfies 1.5 or less.

In the determination step, the 1a polishing particle group may have a particle diameter 37.5 to 125 times the overall average particle size ($D_{50}$) of the polishing particles.

The method of preparing a polishing composition for a semiconductor process may further include an aging step of leaving the composition having undergone the mixing step for several days at room temperature. Through the aging step, a precipitated aggregate may be separated and eliminated. When the polishing particles are ceria, the aging step may be omitted.

The polishing composition prepared by the method of preparing a polishing composition for a semiconductor process may be easily applied to a substrate having a microcircuit pattern thereon and have minimized generation of defects and scratches.

Method of Preparing Polished Article

To achieve the above-described purposes, a method of preparing a polished article according to an embodiment includes a polishing step of polishing a target using the polishing composition for a semiconductor process, wherein the target may be any one or more selected from a substrate, a metal formed on the substrate, and an insulating film formed on the substrate (in an accompanying drawing, $SiO_2$ is illustrated, but the present application is not limited thereto).

Figure 5A:
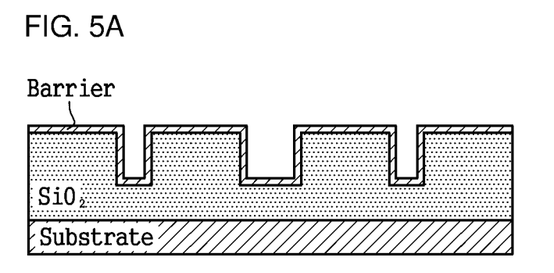
FIGS. 5A, 5B, and 5C are conceptual diagrams showing examples of a substrate (FIG. 5A) having a barrier layer formed on a pattern before the formation of an interconnect metal, a substrate (FIG. 5B) after the formation of an interconnect metal, and a substrate (FIG. 5C) after polishing.
Figure 5B:
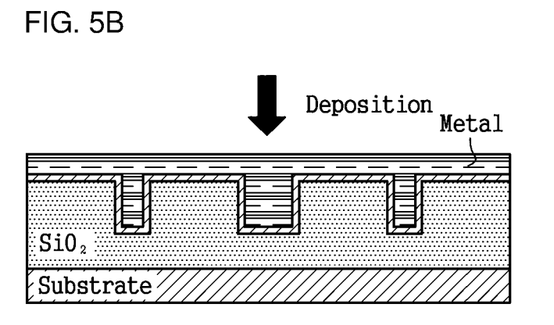
Figure 5C:
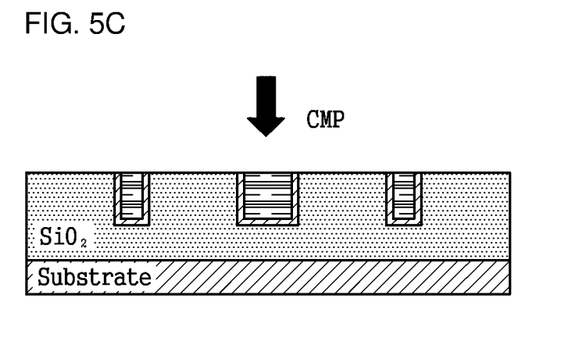

The target may be, as shown in FIG. 5B, a substrate including concave and convex patterns. The target may include a metal in the concave or convex pattern, and specifically, the target may include a barrier layer formed on the pattern; and an interconnection metal formed on the barrier layer. When the interconnection metal is copper, the barrier layer may include tantalum and a nitride thereof. When the interconnection metal is tungsten, the barrier layer may include titanium and a nitride thereof.

The width of the concave pattern may be 3 to 16 nm.

Specifically, referring to FIG. 4, the polishing step may include rotating a polishing pad 400 fixing a substrate W and also rotating a surface plate while bringing the substrate W to be polished, together with a polishing pad 200 adhered to an adhesive layer 100 on the surface plate 300 and a polishing composition S provided from a spray nozzle 500, into contact with the polishing pad.

The polishing step may further include conditioning the surface of the polishing pad before polishing as needed.

The surface plate 300 may be rotated by a surface plate rotation shaft 310, and the polishing head 400 may be rotated by a head rotation shaft 410.

The polishing composition S may polish a wafer in contact with the polishing pad 200 while penetrating into the substrate W fixed to the polishing head 400.

In the polishing step, when the polishing composition S is added and the substrate W is brought in contact with surface plate 200 by the polishing head 400, a pressure of 6.89 to 48.26 kPa or 13.79 to 34.47 kPa may be applied.

The polishing step may be performed for 50 seconds to 10 minutes, which may be changed according to the degree of polishing.

A washing step of washing the substrate having undergone the polishing step may be further included.

The washing step of the polished substrate may be performed using distilled water and an inert gas.

Hereinafter, the present application will be described in further detail with reference to specific examples. The examples are merely provided to help the understanding of the present application, and the scope of the present invention is not limited thereto.

to the conditions of Table 1 below was prepared as a comparative example, and according to the following experimental example below, the absorbance fractions per particle size distribution are shown in Table 2.

TABLE 1

| Classification | Zeta potential of colloidal silica (mV) | pH of silica composition | Average particle size ($D_{50}$) of colloidal silica (nm) | Colloidal silica (g) | Deionized water (g) | Nonionic surfactant* (g) | Fluorine-based surfactant (g) | Capsule filter |
|---|---|---|---|---|---|---|---|---|
| Example 1 | 25 | 4.2 | 38 | 30 | 959.8 | 10 | 0.2 | ○ |
| Example 2 | 27 | 4.1 | 37 | 30 | 929.8 | 40 | 0.2 | ○ |
| Example 3 | 22 | 3.8 | 36 | 30 | 959.5 | 10 | 0.5 | ○ |
| Example 4 | 25 | 4.0 | 37 | 60 | 929.8 | 10 | 0.2 | ○ |
| Comparative Example 1 | 26 | 4.2 | 38 | 30 | 959.8 | 10 | 0.2 | X |
| Comparative Example 2 | 47 | 4.2 | 36 | 30 | 959.8 | 10 | 0.2 | X |
| Comparative Example 3 | 14 | 4.2 | 37 | 30 | 959.8 | 10 | 0.2 | X |
| Comparative Example 4 | 8 | 4.1 | 42 | 30 | 959.8 | 10 | 0.2 | X |
| Comparative Example 5 | 22 | 3.8 | 36 | 30 | 959.5 | 10 | 0.5 | X |
| Comparative Example 6 | 25 | 4.0 | 37 | 60 | 929.8 | 10 | 0.2 | X |
| Comparative Example 7 | 26 | 4.2 | 38 | 30 | 959.8 | 10 | 0.2 | X |

*Polyethylene glycol is applied as nonionic surfactant

Example 1—Composition for Polishing

A silica composition that included colloidal silica surface-modified with amino silane, which has a pH of 4.2, a zeta potential of +24 mV, and an overall average particle size ($D_{50}$) of 38 nm, and deionized water was prepared. To the silica composition, additives, for example, polyethylene glycol having a molecular weight of 600 as a nonionic surfactant for enhancing dispersibility and slurry wettability and a fluorine-based surfactant as a particle defect eliminator were applied, and then the resulting mixture was sufficiently stirred for 2 hours at 350 rpm. Afterward, relatively large particles were sorted by filtering the resulting solution through a 5-inch capsule filter (Micropore) having an average pore size of approximately 0.07 μm, separated, and eliminated.

Table 2 shows the absorbance fractions per particle size distribution according to the following experimental examples.

Examples 2 to 4—Composition for Polishing

In Example 1, the polishing compositions changed to the conditions shown in Table 1 below were prepared according to Examples 2 to 4, and the absorbance fractions per particle size distribution are shown in Table 2 according to the following experimental examples.

Comparative Example—Composition for Polishing

In example 1, the filtering process using a capsule filter was commonly omitted, the polishing composition changed Experimental Example—Measurement of Absorbance of Polishing Particles Slurries were prepared in which the polishing particles prepared in Examples and Comparative Examples were diluted to 0.3 wt % in deionized water, and their absorbances with respect to particle size distribution were measured through DC24000 UHR (CPS Instruments).

Specifically, referring to FIGS. 1A and 1B, a centrifugal particle size analyzer 100, which includes a sorting unit 13 including a space having a ring-shaped cross-section and accommodating a target; a diffusion unit 12 included in the sorting part to provide the target to the sorting unit; an input unit 11 inputting the target to the diffusion unit; a main body 15 finishing the appearances of the sorting unit and the diffusion unit; a rotation unit 16 connected with the main body and rotating the sorting unit in a circumferential direction of the sorting unit; a measurement unit 14 moving in a diameter direction of the sorting unit, applying light to the space in the sorting unit, and measuring the light amount; an irradiation unit 14a applying light into the sorting unit from the measurement unit; and a sensor 14b detecting the amount of light passing through the sorting unit, was provided.

The sorting unit 13 was filled with sucrose having a viscosity of 1.8 cp, and the slurry was added to the input unit. A grain size gradient region of the slurry was formed in the sorting unit by rotating the sorting unit at a speed of 14,000 rpm. At this time, the measurement unit applied light with a wavelength of 405 nm into the grain size gradient region to measure absorbance with respect to particle size distribution of particles in the slurry, and the result is shown in Table 2.

TABLE 2

| Classification | Example 1 | Example 2 | Example 3 | Example 4 | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|---|---|
| 2.8~5 μm absorbance fraction | 8.46 | 9.10 | 12.14 | 3.70 | 26.14 | 10.73 | 13.78 | 11.06 | 13.12 | 18.04 | 25.42 |
| 1.5~2.8 μm absorbance fraction | 8.63 | 6.38 | 18.17 | 12.89 | 25.28 | 21.89 | 29.15 | 28.75 | 25.08 | 23.47 | 22.29 |
| 0.9~1.5 μm absorbance fraction | 4.73 | 7.68 | 12.64 | 13.15 | 14.69 | 20.01 | 18.22 | 16.02 | 22.72 | 13.57 | 14.49 |
| 0.5~0.9 μm absorbance fraction | 6.08 | 7.40 | 5.91 | 9.51 | 6.45 | 7.56 | 6.62 | 7.45 | 7.45 | 6.07 | 5.62 |
| 0.3~0.5 μm absorbance fraction | 7.19 | 8.28 | 3.37 | 3.88 | 3.25 | 2.74 | 2.47 | 3.39 | 2.38 | 2.69 | 2.24 |
| 0.18~0.3 μm absorbance fraction | 5.11 | 4.75 | 1.51 | 1.73 | 2.10 | 1.92 | 1.24 | 1.49 | 1.19 | 1.03 | 0.93 |
| 0.1~0.18 μm absorbance fraction (%) | 2.41 | 2.06 | 0.60 | 0.86 | 1.20 | 1.21 | 0.53 | 0.40 | 0.75 | 0.47 | 0.37 |
| 60~100 nm absorbance fraction | 4.54 | 3.80 | 3.10 | 5.66 | 2.34 | 4.20 | 1.57 | 1.80 | 4.22 | 3.39 | 2.06 |
| 35~60 nm absorbance fraction | 40.67 | 38.70 | 34.20 | 37.87 | 15.15 | 23.74 | 20.16 | 21.21 | 17.76 | 24.73 | 20.19 |
| 20~35 nm absorbance fraction | 12.19 | 11.83 | 8.38 | 10.78 | 3.41 | 6.01 | 6.26 | 8.44 | 5.34 | 6.53 | 6.39 |
| first polishing particle group absorbance fraction | 21.82 | 23.17 | 42.94 | 29.73 | 66.10 | 52.62 | 61.15 | 55.83 | 60.92 | 55.08 | 62.20 |
| 1a polishing particle group absorbance fraction | 17.09 | 15.49 | 30.30 | 16.59 | 51.42 | 32.61 | 42.93 | 39.81 | 38.20 | 41.51 | 47.71 |
| second polishing particle group absorbance fraction | 57.39 | 54.33 | 45.67 | 54.30 | 20.90 | 33.95 | 27.99 | 31.45 | 27.32 | 34.66 | 28.64 |
| Absorbance ratio | 0.38 | 0.43 | 0.94 | 0.55 | 3.16 | 1.55 | 2.18 | 1.78 | 2.23 | 1.59 | 2.17 |

TABLE 2-continued

| Classification | Example 1 | Example 2 | Example 3 | Example 4 | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|---|---|
| (A1/A2)* Absorbance ratio (A1a/A2)* | 0.30 | 0.29 | 0.66 | 0.31 | 2.46 | 0.96 | 1.53 | 1.27 | 1.40 | 1.20 | 1.67 |

Absorbance fraction units: percentage (%)
(A1/A2)*: (absorbance of first polishing particle group)/(absorbance of second polishing particle group)
(A1a/A2)*: (absorbance of 1a polishing particle group)/(absorbance of second polishing particle group)

Experimental Example—Evaluation of Polishing of Polishing Composition

As shown in FIG. 5B, a patterned wafer with a diameter of 300 nm, which included a silicon oxide film having an interconnection groove, a Ti/TiN barrier layer formed on the surface of the silicon oxide film, and a W interconnection metal formed on the barrier layer, was prepared. Afterward, using the CMP polishing apparatus shown in FIG. 4, the silicon wafer was fixed to the polishing head, and the surface of the silicon wafer was set face down on the surface plate to which the polishing pad laminate was adhered. Then, the wafer surface was polished by adjusting the polishing pressure to 1.0 psi, and rotating the surface plate at 103 rpm and the polishing head at 97 rpm for 1 minute while adding each of the slurries according to Examples and Comparatively Examples in Table 2 to the polishing pad at 250 ml/min.

After polishing, the silicon wafer was separated from the polishing head, and first washed with distilled water and 0.1 ammonia water, secondarily washed with 0.1% hydrofluidic acid, and dried in an inert atmosphere for 20 seconds, and then the condition of scratches on the surface of the interconnection pattern and the degree of polishing were identified using an AIT XP+ apparatus (KLA Tencor). The result is shown in Table 3.

A polishing composition for a semiconductor process according to one embodiment can exhibit precise and reliable polishing performance in the implementation of a fine pattern by allowing the absorbance of a polishing particle group excessively forming defects and scratches to be a specific ratio or less compared to a polishing particle group corresponding to several times the overall average particle size ($D_{50}$) in the formation of a fine circuit pattern.

In addition, by presenting the absorbance ratio of the polishing composition for a semiconductor process by a light scattering measurement method through centrifugation, it is possible to control coarse particles difficult to reliably confirm by a conventional dynamic light scattering measurement method and to exhibit precise and highly-reliable polishing performance in the implementation of a fine circuit pattern.

While the present application has been described in detail with reference to exemplary embodiments of the present invention, it should be understood by those of ordinary skill in the art that the scope of the present invention is not limited thereto and various modifications and alterations based on the fundamental ideas of the present application defined by the accompanying claims are also included within the scope of the present invention.

TABLE 3

| Classification | Example 1 | Example 2 | Example 3 | Example 4 | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|---|---|---|
| Scratch* | 0 | 0 | 0 | 0 | 8 | 3 | 1 | 2 | 1 | 1 | 11 |
| Silicon oxide cutting amount in 1-min polishing | 1103 Å | 1098 Å | 1111 Å | 1721 Å | 893 Å | 812 Å | 1231 Å | 568 Å | 1051 Å | 1102 Å | 1972 Å |

*Scratch indicates the number of defects with a length of 1 μm or more.

Figure 2:
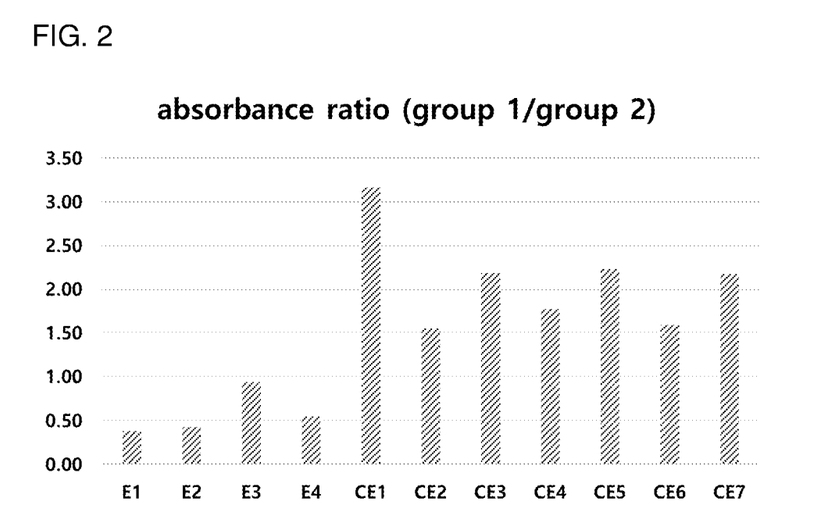
FIG. 2 is a graph showing the A1/A2 (group 1/group 2) ratios of Examples 1 to 4 (E1 to E4) and Comparative Examples 1 to 7 (CE1 to CE7)

As shown in FIG. 2, it was confirmed that, in Examples 1 to 4 (E1 to E4) in which the ratio of the absorbance of the first polishing particle group (group 1) to the absorbance of the second polishing particle group (group 2) is 1.5 or less, a stable polishing rate of 1,000 Å or more was exhibited.

On the other hand, in Comparative Examples 1 to 7 (CE1 to CE7) in which the ratio of the absorbance of the first polishing particle group to the absorbance of the second polishing particle group exceeds 2, the proportion of relatively coarse particles was high, so many scratches were generated, and the polishing rate tended to be low or irregular.

[Description of Reference Numerals]

- 10: absorbance measurement apparatus
- 11: input unit
- 12: diffusion unit
- 13: sorting unit
- 14: measurement unit
- 14a: irradiation unit
- 14b: sensor
- 15: main body
- 16: rotation unit
- 100: adhesive layer
- 200: polishing pad

| [Description of Reference Numerals] |
| --- |
| 300: surface plate |
| 310: surface plate rotation shaft |
| 400: polishing head |
| 410: head rotation shaft |
| 500: spray nozzle |
| W: substrate |
| S: polishing composition |

What is claimed is:

1. A polishing composition for a semiconductor process, comprising:
   polishing particles,
   wherein the polishing particles have an overall average particle size corresponding to $D_{50}$, and comprises a plurality of polishing particle groups with different average particle sizes,
   in which a first polishing particle group is a group with a particle diameter more than 22.5 times and 125 times or less the overall average particle size,
   a second polishing particle group is a group with a particle diameter more than 0.5 times and 2.5 times or less the overall average particle size,
   an absorbance is defined by Equation 1 below, and
   a ratio A1/A2 of the absorbance A1 of the first polishing particle group and the absorbance A2 of the second polishing particle group is 0.38 to 1.5:

$$\text{Absorbance} = \log(I0/I1) \qquad [\text{Equation 1}]$$

In Equation 1, I0 is an amount of light when irradiating light of at least one wavelength of 385 to 425 nm in a liquid in which a grain size gradient is formed by centrifuging the polishing composition for a semiconductor process, and I1 is an amount of the irradiated light passing through the liquid, and
   wherein the polishing composition has a zeta potential of 15 to 45 mV.

2. The composition of claim 1, wherein the overall average particle size ($D_{50}$) of the polishing particles is 20 to 60 nm.

3. The composition of claim 1, wherein the absorbance fraction of the first polishing particle group with respect to the absorbance of the total polishing particles is 50% or less.

4. The composition of claim 1, wherein the absorbance fraction of the second polishing particle group with respect to the absorbance of the total polishing particles is 38% or more.

5. The composition of claim 1, wherein a 1a polishing particle group is a group with a particle diameter 37.5 to 125 times the overall average particle size, and
   the ratio A1a/A2 of the absorbance A1a of the 1a polishing particle group and the absorbance A2 of the second polishing particle group is 0.8 or less.

6. The composition of claim 1, wherein the polishing particles comprise any one or more polishing particles selected from the group consisting of silica, ceria, cerium hydroxide, diamond, zirconia, titania, zeolite, and silicon nitride.

7. The composition of claim 1, which comprises the polishing particles at 5 wt % or more and 20 wt % or less, and comprises one or more additives selected from the group consisting of a dispersant, a corrosion inhibitor, a polishing rate enhancer, a pH adjuster, and a surfactant.

8. The composition of claim 1, wherein, in Equation 1, the rotational speed in centrifugation is 14,000 rpm, and the viscosity of the liquid is 1.8 cp.

9. The composition of claim 1, which is applied as a slurry for chemical mechanical polishing.

10. The composition of claim 1, wherein a scratch is a defect having a length of 1 μm or more,
    when polishing a silicon wafer, the polishing rate is 1,000 Å/min or more, and
    less than one scratch is formed on the polished silicon wafer.

11. The composition of claim 1, wherein the particle diameter of the first polishing particle group is 0.9 to 5 μm, and the particle diameter of the second polishing particle group is 20 to 100 nm.

12. A method of manufacturing a polished article, comprising:
    a polishing step of polishing a target using the polishing composition for a semiconductor process,
    wherein the target is any one or more selected from the group consisting of a substrate, a metal formed on the substrate, and an insulating film formed on the substrate, and
    wherein the polishing composition for a semiconductor process comprises polishing particles that have an overall average particle size corresponding to $D_{50}$ and comprise a plurality of polishing particle groups with different average particle sizes,
    in which a first polishing particle group is a group with a particle diameter of more than 22.5 times and 125 times or less the overall average particle size,
    a second polishing particle group is a group with a particle diameter of more than 0.5 times and 2.5 times or less the overall average particle size,
    an absorbance is defined by Equation 1 below, and
    a ratio A1/A2 of the absorbance A1 of the first polishing particle group and the absorbance A2 of the second polishing particle group is 1.5 or less:

$$\text{Absorbance} = \log(I0/I1) \qquad [\text{Equation 1}]$$

In Equation 1, I0 is an amount of light when irradiating light of at least one wavelength of 385 to 425 nm in a liquid in which a grain size gradient is formed by centrifuging the polishing composition for a semiconductor process, and I1 is an amount of the irradiated light passing through the liquid, and
   wherein the polishing composition has a zeta potential of 15 to 45 mV.

13. The method of claim 12, wherein the target has a substrate having a concave or convex pattern on the surface thereof,
    the concave or convex pattern comprises a metal, and
    the width of the concave pattern ranges from 3 to 16 nm.

* * * * *